US005552961A

United States Patent [19]
Van Gaal et al.

[11] Patent Number: 5,552,961
[45] Date of Patent: Sep. 3, 1996

[54] ELECTRONIC UNIT

[75] Inventors: Adrianus P. Van Gaal; Richard J. Humphreys, both of Kanata; John C. Atkinson, Ottawa; Amit Chawla; Yee-Ning Chan, both of Nepean, all of Canada

[73] Assignee: Northern Telecom Limited, Montreal, Canada

[21] Appl. No.: 443,515

[22] Filed: May 18, 1995

[51] Int. Cl.⁶ ........................................ H05K 7/20
[52] U.S. Cl. ................ 361/700; 165/104.21; 257/712; 257/714; 361/704; 361/710; 361/715
[58] Field of Search ............... 165/80.5, 104.11, 165/104.19, 104.21, 104.33; 174/15.2, 16.3; 257/718–719, 712, 714, 726–727, 795, 796; 361/689, 698–699, 700, 704, 707–710, 714–715, 730, 752

[56] References Cited

U.S. PATENT DOCUMENTS 4,273,183  6/1981  Altoz et al. ..................... 165/185

FOREIGN PATENT DOCUMENTS 6163758  6/1994  Japan .......................... 257/718

*Primary Examiner*—Gregory D. Thompson
*Attorney, Agent, or Firm*—R. J. Austin

[57] ABSTRACT

Electronic unit in which a printed circuit board is located within a housing which includes a heat sink. The board is normally urged out of heat conductive relationship with the heat sink. As temperature increases the circuit board and heat sink are caused to move relatively so as to bring the board into heat conductive relationship with the heat sink so as to remove heat from the board. As temperature decreases the board and heat sink are again moved out of heat conductive relationship. Preferably a heat conduction element is provided to conduct heat from the board. This comprises at least one compressible member, e.g. compressible cellular material, which is progressively compressed as temperature increases. Preferably the heat conductive efficiency of the compressible member increases as compression increases.

20 Claims, 2 Drawing Sheets

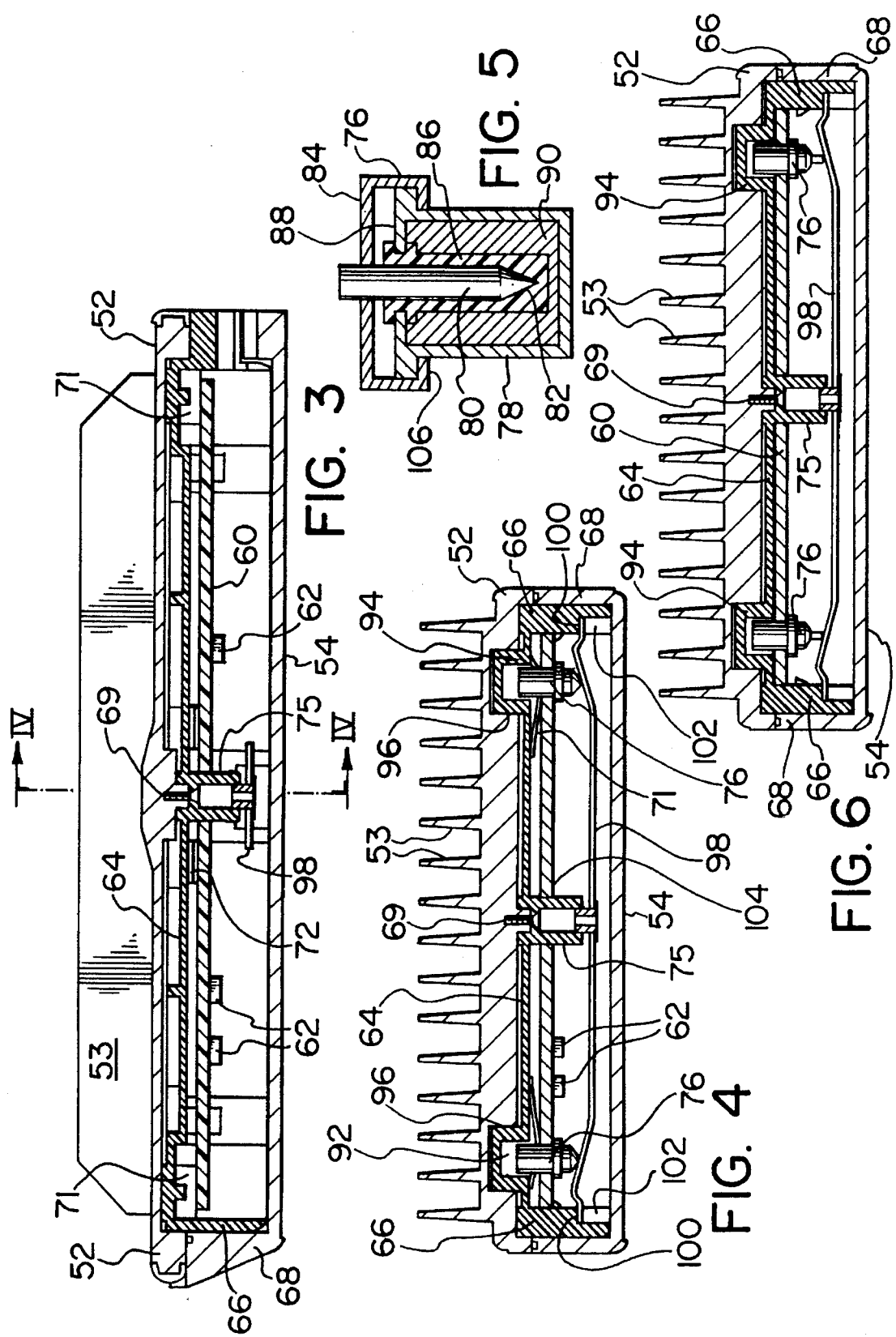

ELECTRONIC UNIT

This invention relates to electronic units.

A printed circuit board for use in electronic equipment conventionally has electronic components mounted upon it to provide an assembly conveniently referred to herein as "an electronic circuitry member". In use, electronic components generate heat and operate most efficiently within certain desired ranges of operating temperatures. However, additional heat needs to be removed to prevent excessive heat build-up which may result in the components failing in operation. Such failure does, of course, lead to expenditure in maintenance and repair procedures as well as in the cost of replacement parts or in the complete electronic circuitry members. For inside and outside use, electronic equipment is sometimes provided with electrically operated fans to remove unwanted heat. Indoor temperatures normally range between 20° C. and 25° C. with short temperature extremes between 0° C. and 50° C. However, outside temperatures can average between −20° C. and 35° C. with average daily fluctuations of 15° C. Temperature extremes from −50° C. to +50° C. may occur and the problem is exacerbated in that low temperature conditions occur at night when power dissipation from the equipment is at its minimum and radiation to the night sky is providing maximum cooling. Conversely, high temperature peaks occur when the equipment is at its maximum power dissipation and solar loading is at its maximum. Electrically controlled heating means are provided, particularly for use in outside environments which are subject to such large differences in temperature, such heating means being operable in concert with the cooling fans to maintain the electronic components within normal operating temperature ranges. In these cases, it is not unusual to incorporate shut-off dampers operating in conjunction with fan operation either to allow flow of cooling air or to prevent cooling air circulation when the heating means is switched on.

As may be seen from the above, continued operation of electronic components incorporated in electronic equipment is dependent upon temperature control being maintained. Thus, if there is a breakdown in temperature control devices then failure in one or more electronic components may be prevented only if the breakdown is corrected sufficiently quickly. Electronic equipment using both cooling and heating devices is most vulnerable to breakdown. In particular, electronic equipment used in outside environments incorporates both cooling and heating devices and because of outside location it is not practical, is most situations, for personnel to be expected to maintain regular inspections of the equipment to ascertain its correct operation. Also, outside repair may be extremely time consuming, because of location and weather conditions, as compared to a similar inside repair operation. There is therefore a high potential risk that breakdown in relatively inexpensive heating and/or cooling devices will result in failure of electronic components which could be extremely expensive to replace, for instance if the whole of a printed circuit board carrying the component needs to be replaced.

The present invention seeks to provide an electronic unit which, in use, maximizes the reliability of operation of its electronic components, thereby minimizing life cycle costs of the unit to a customer.

According to the present invention, an electronic unit comprises a housing including a heat sink, an electronic circuitry member within the housing, biasing means normally operable to urge the heat sink and the circuitry member away from relative positions in which the circuitry member is in heat conduction relationship with the heat sink, and means heat conductively connected to the circuitry member and operable as temperature increases through specific high temperature conditions to urge the circuitry member and the heat sink into relative positions in which the circuitry member is in heat conductive relationship with the heat sink to remove heat from the circuitry member, the means heat conductively connected to the circuitry member then being operable as temperature decreases through the specific temperature conditions to allow the biasing means to urge the heat sink and the circuitry member away from their relative positions in heat conductive relationship.

In use of the unit of the invention, the circuitry member is held out of heat conductive relationship with the heat sink until at the specific temperature conditions, heat conduction into the heat sink is permitted. Hence, when heat conduction is permitted it is to cause a reduction in temperatures throughout the circuitry member and, upon the temperature decreasing through the specific temperature condition, the circuitry member is removed from heat conductive relationship with the heat sink. Heat conduction is thus terminated until the higher temperature conditions are once more obtained. As a result, operation of the circuitry member is controllable within a temperature range conducive to its continued operation.

For greater control of the operational temperatures of the circuitry member, three preferred features are included either separately or in combination, dependent upon design requirements. In one of the preferred features, heat conduction means is disposed intermediate the heat sink and the circuitry member. This heat conduction means is compressible and increases in heat conduction efficiency as compression increases. Thus, as the circuitry member approaches the heat sink, heat conductivity increases to extract heat from the circuitry member at a faster rate.

Another of the preferred features comprises the use of a phase change material as part of the means heat conductively connected to the circuitry member. In this preferred feature, this means comprises a cylinder, piston means movable within the cylinder and extending outwardly from the cylinder, and a phase change material within the chamber of the cylinder, the biasing means urging the piston means inwardly of the cylinder into a position dictated by the volume of the phase change material. The phase change material is in a solid phase at temperatures below the specific high temperature conditions and in a liquid phase at temperatures above the specific high temperature conditions, expansion of the material accompanying change to the liquid phase to urge the circuitry member towards the heat sink. As may be seen, the change of the phase change material into its liquid phase, is progressive and occurs by extraction of heat from the circuitry member and, if sufficient heat is extracted, then the phase change into liquid is completed.

When the phase change material is used in a unit which also includes the above compressible heat conduction means, a further temperature control advantage results. Progressive phase change provides a gradual, as distinct from a sudden movement of the circuit member towards the heat sink as the temperature of the circuitry member increases and more heat is taken into the phase change material. This gradual movement results in progressively increasing compression of the heat conduction means so that heat is also extracted at a progressively increasing rate into the heat sink and the heat transfer into the phase change material commences to drop. There is then a tendency for the phase change material to cease changing or to change more slowly into the liquid state thereby reducing the speed of movement of, or ceasing movement of, the unit towards the heat sink. Hence, and as the case may be, this slows down or stops increase in compression of the heat conduction means. The amount of phase change material which exists in the liquid state is thus influenced by the temperature of the circuitry member, thereby controlling the position of the unit relative to the heat sink. This provides temperature control of the circuitry member between established and possibly relatively close upper and lower limits.

A third preferred feature includes the provision of a heat insulating means between the circuitry member and the heat sink. The heat insulating means substantially minimizes heat transfer to the heat sink through convection and radiation thereby ensuring substantially complete heat transfer control through the conductivity path of the heat conducting means from circuitry member to the heat sink.

With the invention and the incorporation of at least one and preferably all of the above-described three preferred features, designs of electronic units are possible each of which is operable through wide ranges of ambient temperatures, which may be cyclic, e.g. ranges between −50° C. and +50° C. while enabling electronic components to continue operation within comfortable operational temperature ranges. Designs of the units may also be such as to hold temperatures inside the units slightly above ambient temperatures to prevent moisture formation upon the components.

Embodiments of the invention will now be described, by way of example, with reference to the accompanying drawings, in which:

FIG. 3 is a cross-sectional view through the unit of FIG. 2 with the housing closed, the cross-section taken along line III—III in FIG. 2;

FIG. 4 is a cross-sectional view through the unit of FIG. 2 with the housing closed and taken along line IV—IV in FIG. 3;

FIG. 5 is a cross-sectional view, to much larger scale, through a part of the electronic unit of the second embodiment; and FIG. 6 is a view similar to FIG. 4 showing the relative positions of parts of the unit of the second embodiment in use and under increased temperature conditions.

Figure 1:
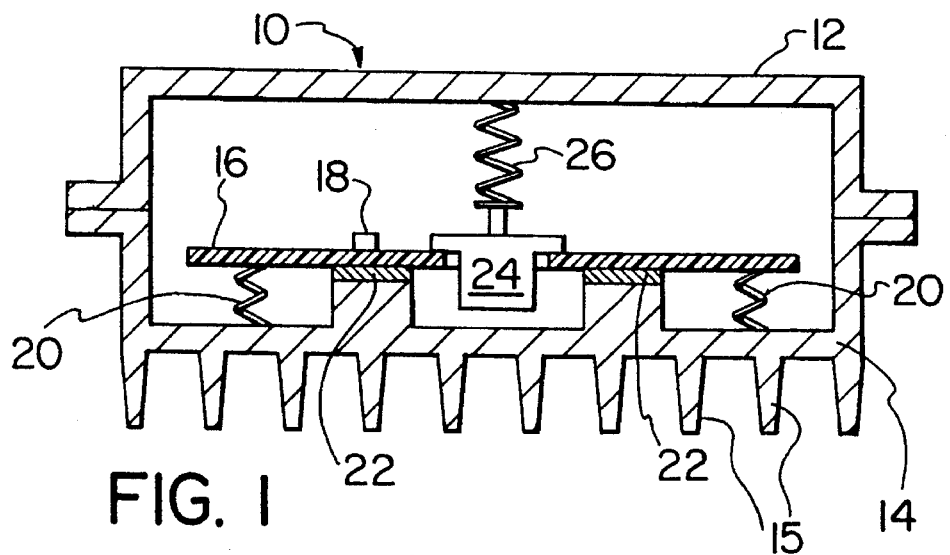
FIG. 1 is a cross-sectional view through an electronic unit according to a first and basic embodiment.

In a first embodiment as shown by FIG. 1, which is a basic structure of the invention, an electronic unit 10 has a housing 12 including on one side of it a heat sink 14 including fins 15. The housing encloses an electronic circuitry member comprising a base plate or printed circuit board 16 carrying a plurality of electronic components 18 (only one of which is shown), the operating temperature of which needs to be controlled.

Biasing means in the form of a plurality of springs (shown here basically as compression springs 20) is operable to urge the printed circuit board out of a position in heat conductive relationship with the heat sink, that is in a direction away from the heat sink. Between the heat sink and the printed circuit board is a compressible heat conduction means (shown as two cellular silicon pads 22), the pads 22 bonded to the inside of the housing forming the heat sink. Heat conductivity of the pads 22 increases as compression of the pads is increased.

Acting against the springs 20 is a means 24 which is heat conductively connected to the printed circuit board 16 and which is operable in cooperation with a spring 26 and at a specific high temperature condition to urge the printed circuit board towards the heat sink, thereby compressing the pads 22. The means 24 is basically similar to a means heat conductively connected to a printed circuit board in the second embodiment to be described and incorporates a phase change material which expands as it changes from a solid to a liquid state and is thus able to apply pressure to the printed circuit board to urge it against and compress the pads 22. The change in phase occurs progressively as more heat is taken into the material from the component 18 and printed circuit board 16 and this is accompanied by progressive movement of the printed circuit board towards the heat sink. This action progressively increases compression on the pads 22 thereby increasing their conductivity. Hence, as the temperature of the component 18 and printed circuit board 16 increase, the printed circuit board is urged closer to the heat sink and the heat is conducted at a faster rate into the heat sink. When heat conduction into the heat sink is sufficiently high that there is a decrease in the temperature of the circuitry member, the phase change material loses heat and commences to revert back to the solid condition. This results in movement of the printed circuit board away from the heat sink, lessening compression on the pads 22 and thereby decreasing the heat conduction rate to the heat sink. As a result, the printed circuit board 16 and the components 18 are maintained within an operational range of temperatures which is dependent upon the design of the unit.

Figure 2:
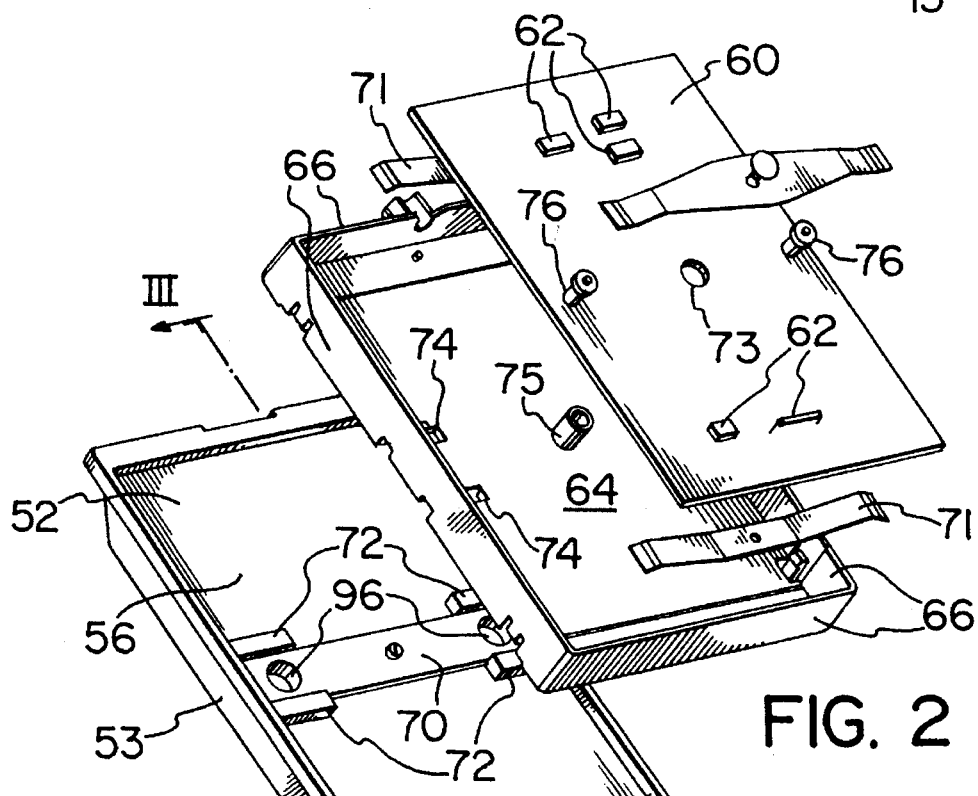
FIG. 2 is an exploded isometric view of an electronic unit according to a second embodiment with a housing of the unit in an open position.

In a second embodiment as shown in FIGS. 2 to 6, an electronic unit 50 comprises a metal housing comprising a metal heat sink plate structure 52 having externally extending fins 53 and the cover 54 which when closed upon the structure 52 by hinging action, provides an internal chamber (see FIGS. 3, 4 and 6). Structure 52 has an internal planar surface 56 (FIG. 2 particularly).

Within the chamber of the housing is located an electronic circuitry member comprising a planar base element or printed circuit board 60 having on one surface a plurality of electronic components 62 such as is exemplified by FIGS. 2, 3, 4 and 6. The printed circuit board 60 is insulated from the heat sink structure 52 by a heat insulating means in the form of a planar plastic insulating member 64 which has walls 66 extending around side edges of the printed circuit board to insulate these edges from side flanges 68 of the structure 52 and from the cover 54. The planar insulating member is secured by a central screw 69 (FIGS. 3, 4 and 6) extending through an end wall of a hollow spigot 75 of the member 64, the screw 69 extending into a rectangular integral rib 70 upstanding from and extending from side-to-side across the surface 56 of the heat sink structure 52 at a position mid-way between its ends (see FIG. 2).

Biasing means provided to urge the printed circuit board 60 away from the member 64 and thus away from the heat sink, comprises two leaf springs 71 which lie parallel in spaced positions (FIG. 2) one between each end of the printed circuit board and the member 64, these springs thus effectively urging the printed circuit board and insulating member 64 apart. For the purpose of providing for this movement, the printed circuit board 60 has a central hole 73 by which the printed circuit board is slidably received upon the spigot 75 of the insulating member 64.

A heat conduction means is disposed between the heat sink surface 56 and the printed circuit board 60. This heat conduction means comprises a plurality of thermally conductive pads which, in this embodiment, consists of four rectangular compressible silicon open cellular pads 72 positioned in two pairs with the pads in each pair spaced-apart one on each side of a respective end region of the rectangular integral rib 70 of the structure 52. Each pad extends through a respective aperture 74 (FIG. 2) in the planar insulating member 64 to contact the facing side of the printed circuit board 60 when this moves towards the member 64 as will be described. Although silicon is described for use with the cellular pads 72, any other suitable material may be used for the compressible structure with the preferred requirement being that heat conductivity increases as the pads are being compressed.

Means is provided which is operable as temperature increases through specific temperature conditions to move the printed circuit board 60 towards the heat sink structure surface 56 against the influence of the springs 71. This means comprises two piston and cylinder means 76. As shown by FIG. 5, each piston and cylinder means 76 comprises a cylinder 78 with a piston means, i.e. piston 80, movable within and extending out from the cylinder. Piston 80 is in the form of a solid rod having a tapered inner end 82 within the cylinder. The piston is radially spaced from and is concentric with walls of the cylinder 78 and is guided for axial movement by sliding reception within an annular guide 84 which caps the otherwise open end of the cylinder. The part of the piston within the cylinder is surrounded by a liquid impermeable polymeric barrier or sleeve 86 which is sealed to an inwardly extending flange 88 of the cylinder at its open end. Within and wholly containing the volume of the cylinder unoccupied by the piston and the sleeve 86, is a phase change material 90. This phase change material is required to be in solid condition when the unit 50 is not operating and is required to change to a liquid state under the required high temperature conditions to help maintain operating temperatures of the printed circuit board 60 and each of the components 62 within desired limits which are not detrimental to continued operation. The choice of the material 90 is partly dependent upon the design of the unit 50 and upon the required operating temperatures of the electronic components. Among materials which are favored for this purpose are paraffin wax, neopental glycol, sodium thiosulfatepentahydrate and sodium pyrophosphate decahydrate. All of these materials have melting temperatures as required for this embodiment, i.e. between 42° C. and 63° C. and necessarily increase in volume as they change to the liquid state. As may be seen from the above as the material 90 changes from solid to a liquid state, its expansion causes it to act through the sleeve 86, against the tapered end 82 of the piston 80 thereby forcing the piston axially outwards from the cylinder 78. Other phase change materials suitable for this purpose and as may be used in embodiments of different design and perhaps suitable for other temperature range control requirements include calcium chloride hexahydrate, sodium sulfate decahydrate, hydrated sodium orthophosphate, sodium acetate trihydrate and magnesium nitrate hexahydrate. In addition, an eutectic mixture of magnesium nitrate hexahydrate and ammonium nitrate, or an eutectic mixture of magnesium chloride and magnesium nitrate hexahydrate has been found suitable. Further suitable materials include a mixture of calcium chloride and calcium bromide hexahydrate and a mixture of sodium sulfate decahydrate and sodium chloride.

As shown in FIGS. 2, 4 and 6, each piston and cylinder means 76 is located with the cylinder 78 passing through a bore in the printed circuit board 60 and extending into guided reception within a chamber 92 provided by a blind bore in an outwards extension 94 of the insulating member 64. Extension 94 is received within a complementary bore 96 (FIG. 2) extending into the rectangular rib 70 of the structure 52, with the bore 96 in a position between pads 72 of a respective pair. Free ends of the pistons 80 abut against opposite end regions of another leaf spring 98 disposed upon the opposite side of the printed circuit board from the leaf springs 71. The leaf spring 98 lies parallel to and is centrally located relative to the springs 71 to provide a resilient means stiffer than the combined stiffnesses of the springs 71. The spring 98 is secured to the free end of the spigot 75 and has ends biased towards the heat sink structure 52, these ends engaging stop means provided by end surfaces 100 in recesses 102 (FIGS. 4 and 6) in opposite sides of the insulating member 64.

The unit 50 is constructed with the two piston and cylinder means 76 constrained between the spring 98 and a surface 104 of the printed circuit board which faces the spring 98 and against which an abutment shoulder 106 (FIG. 5) of each cylinder 78 is engaged. Springs 98 and 71 which operate in opposite directions tend to urge the pistons 80 into their respective cylinders.

In use of the unit 50, at low operating temperatures or upon commencement of operation, the various features are in the relative positions shown by FIGS. 3 and 4. As may be seen from these figures, springs 71 hold the printed circuit board 60 away from the insulating member 64, free ends of the piston rods 80 of the means 76 forced against the leaf spring 98. In this condition, as shown particularly by FIG. 3, the silicon pads 72 which extend through the apertures 74 in the member 64 are spaced away from the printed circuit board 60 so that virtually no heat exchange by conduction takes place into the heat sink. Also, the heat insulating member 64 under all conditions of operation, completely insulates the printed circuit board and its components from the heat sink structure 52 substantially to prevent heat being transmitted to the structure by convection, radiation or by conduction.

Electronic components in use generate heat which increases their temperatures and also the temperature of the printed circuit board 60 to which they are connected. This heat is transmitted into each of the piston and cylinder means 76 and as the temperature increases through specific temperature conditions, the phase change material 90 within the means 76 commences to change in phase from a solid to a liquid state. This phase change conversion, which is designed to occur within the operating range of temperatures of the components on the printed circuit board 60, is accompanied by expansion of the phase change material thereby forcing the piston rods 80 outwardly from their respective cylinders in the manner described above. The free ends of the piston rods 80 in acting against the spring 98 then cause the printed circuit board to move towards the heat insulating member 64 by virtue of resilient deflection of the springs 71 which are weaker than the spring 98. When the movement of the printed circuit board in this direction proceeds, the board initially makes contact with the silicon pads 72 and then proceeds to compress the pads progressively as temperatures continue to increase. After initial contact with the pads 72 by the board, heat is then transmitted by conduction through the pads into the heat sink structure 52 and this heat transfer increases as the pads become more compressed. Eventually, as compression proceeds, the heat transfer through the pads 72 occurs at a faster rate than the heat build-up within the chamber of the housing and ultimately the phase change material 90 commences to revert back to its solid state. This occurs when the temperatures of the printed circuit board and its electrical components commence to drop away from an upward limiting temperature as heat is extracted. Upon the phase change material reverting back to a solid condition again, the springs 71 then urge the printed circuit board away from the heat sink once more and decrease the pressure upon the pads 72 so that heat transfer progressively decreases into the printed circuit board. Thus, a temperature control condition is achieved in which as temperature within the housing chamber increases more heat is extracted by the silicon pad 72 into the heat sink and when the heat transfer proceeds at a suitably high rate then the temperature within the chamber decreases once more thereby resulting in less compression of the pads 72 and less heat transfer. As a result of this operation, the temperature within the chamber of the housing and thus the temperatures of the components upon the printed circuit board 60 may be maintained between upper and lower operational limits for the components.

As is clear from the embodiments and from the invention, temperature control for the electronic components is performed without recourse to heating and cooling equipment which requires power generation. In contrast, in the invention and as shown by the embodiments the heating and cooling is performed completely automatically by a design which in operation, uses specific properties of features of the unit itself.

What is claimed is:

1. An electronic unit comprising a housing including a heat sink, an electronic circuitry member within the housing, biasing means normally operable to urge the heat sink and the circuitry member away from relative positions in which the circuitry member is in heat conductive relationship with the heat sink, and means heat conductively connected to the circuitry member and operable as temperature increases through specific temperature conditions to urge the circuitry member towards the heat sink to bring the circuitry member into heat conductive relationship with the heat sink and remove heat from the circuitry member, the means heat conductively connected to the circuitry member then being operable as the temperature decreases through the specific temperature conditions to allow the biasing means to urge the circuitry member away from the heat sink and out of heat conductive relationship with the heat sink, the electronic unit also including a heat conduction means disposed intermediate the heat sink and the circuitry member, the heat conduction means being compressible and increasing in heat conductive efficiency as compression increases, the heat conduction means being compressed between the heat sink and the circuitry member as the circuitry member moves towards the heat sink.

2. An electronic unit according to claim 1 wherein the heat conduction means comprises at least one member of compressible cellular material.

3. An electronic unit comprising a housing including a heat sink, an electronic circuitry member within the housing, biasing means normally operable to urge the heat sink and the circuitry member away from relative positions in which the circuitry member is in heat conductive relationship with the heat sink, and means heat conductively connected to the circuitry member and operable as temperature increases through specific temperature conditions to urge the circuitry member towards the heat sink to bring the circuitry member into heat conductive relationship with the heat sink and remove heat from the circuitry member, the means heat conductively connected to the circuitry member then being operable as the temperature decreases through the specific temperature conditions to allow the biasing means to urge the heat sink and the circuitry member away from the heat sink and out of heat conductive relationship with the heat sink, and wherein the means operational through specific high temperature conditions comprises a cylinder, piston means movable within the cylinder and extending outwardly from the cylinder, and a phase change material within a chamber of the cylinder, the biasing means urging the piston means inwardly of the cylinder into a position dictated by the volume of the phase change material, the phase change material being in a solid phase at temperatures below the specific high temperature conditions and in a liquid phase at temperatures above the specific high temperature conditions, expansion of the material accompanying change to the liquid phase to urge the circuitry member towards the heat sink.

4. An electronic unit according to claim 3 wherein the piston is spaced from the walls of the cylinder and is surrounded by a liquid impermeable barrier which seals the cylinder chamber from ambient conditions, and the phase change material occupies the whole of the volume of the cylinder chamber which is unoccupied by the piston and by the liquid impermeable barrier.

5. An electronic unit according to claim 3 including a heat conduction means disposed intermediate the heat sink and the circuitry member, the heat conduction means being compressible and increasing in heat conductive efficiency as compression increases, the heat conductive means being compressed between the heat sink and the circuitry member as the circuitry member moves towards the heat sink.

6. An electronic unit comprising a housing including a heat sink, an electronic circuitry member within the housing, the electronic circuitry member comprising a planar base element and at least one electronic component carried by the planar base element, heat insulating means disposed between the circuitry member and the heat sink, biasing means normally operable to urge the heat sink and the circuitry member away from relative positions in which the circuitry member is in heat conductive relationship with the heat sink, and means heat conductively connected to the circuitry member and operable as temperature increases through specific temperature conditions to urge the circuitry member towards the heat sink to bring the circuitry member into heat conductive relationship with the heat sink and remove heat from the circuitry member, the means heat conductively connected to the circuitry member then being operable as the temperature decreases through the specific temperature conditions to allow the biasing means to urge the heat sink and the circuitry member away from the heat sink and out of heat conductive relationship with the heat sink.

7. An electronic unit according to claim 6 including heat conduction means disposed intermediate the heat sink and the planar base element, the heat conduction means comprising at least one compressible member extending through the insulating means to provide a heat conductive path between the heat sink and the planar base element as the circuitry member is urged towards the heat sink, the compressible member increasing in heat conductive efficiency as compression increases, and the compressible member being compressed between the heat sink and the circuitry member as the circuitry member moves towards the heat sink.

8. An electronic unit according to claim 7 wherein the at least one compressible member is made from a compressible cellular material.

9. An electronic unit according to claim 8 wherein the at least one compressible member is formed from silicon.

10. An electronic unit according to claim 7 wherein the heat insulating means comprises a substantially planar heat insulating element facing one side of the planar base element.

11. An electronic unit according to claim 10 wherein the biasing means is disposed between one side of the planar base element and the heat insulating element and a resilient means, stronger than the biasing means is located in a position spaced from the other side of the planar base element, stop means being provided to limit movement of the resilient means towards the base element, and the means operable at the specific high temperature conditions is disposed between the resilient means and the planar base element to urge the planar base element away from the resilient means as it is being urged towards the heat sink.

12. An electronic unit according to claim 11 wherein the means operable as the temperature increases through specific high temperature conditions comprises at least one cylinder and piston means in each of which the piston means is movable within the cylinder and extend outwardly from the cylinder, and a phase change material is disposed within a chamber of the cylinder, the biasing means normally urging the planar base element towards the resilient means and to urge the piston inwardly of the cylinder into a position dictated by the phase change material which is in a solid phase at temperatures below the specific high temperature conditions and the liquid phase at temperatures above the specific high temperature conditions, expansion of the phase change material accompanying change to the liquid phase to urge the piston means outwards thereby urging the planar base element away from the resilient means and towards the heat sink.

13. An electronic unit according to claim 12 wherein in the at least one cylinder and piston means, the piston is spaced from walls of the cylinder and is surrounded by a liquid impermeable barrier which seals the cylinder chamber from ambient conditions, and the phase change material occupies the whole of the volume of the cylinder chamber which is unoccupied by the piston and by the liquid impermeable barrier.

14. An electronic unit according to claim 12 wherein the heat conduction means comprises at least one compressible member extending through the insulating means to provide a heat conductive path between the heat sink and the planar base element as the circuitry member is urged towards the heat sink, the compressible member increasing in heat conductivity efficiency as compression increases, the compressible member being compressed between the heat sink and the circuitry member as the circuitry member moves towards the heat sink.

15. An electronic unit according to claim 14 wherein the at least one compressible member is made from a compressible cellular material.

16. An electronic unit according to claim 15 wherein the at least one compressible member is formed from silicon.

17. An electronic unit according to claim 12 wherein a plurality of cylinder and piston means are included and the biasing means includes a plurality of biasing springs, the plurality of cylinder and piston means and the plurality of biasing springs positioned to insure movement of the planar base element towards and away from the heat sink while maintaining the element in any one of an infinite number of parallel planes.

18. An electronic unit according to claim 17 wherein in each piston and cylinder means, the cylinder acts against said other side of the planar base element and extends through the planar base element to slidably move within a chamber defined by the heat insulating element, the heat insulating element insulating the cylinder from the heat sink, and the piston extends outwards from the cylinder to act against the resilient means which comprises a leaf spring.

19. An electronic unit according to claim 18 wherein the heat insulating means also includes mounting means for the planar base element, the mounting means extending from the heat insulating means with the planar base element slidable upon the mounting means for movement towards and away from the heat insulating element, the heat insulating means also including insulating wall means which extends downwardly around edges of the planar base element to heat insulate it from the housing and heat sink and the resilient means is mounted upon the free end of the mounting means with the stop means for the resilient spring provided by surface means of the insulating wall means.

20. An electronic unit comprising a housing having at one side a heat sink comprising a planar wall with heat exchange projections extending exteriorly of the housing;

an electronic circuitry member comprising a planar base element within the housing and disposed parallel to the planar wall, the circuitry member including electronic components mounted upon the planar base element;

a heat insulating means comprising a planar heat insulating element extending between the planar base element and the planar wall of the heat sink;

biasing means to urge the circuitry member away from the heat sink and into a position of minimal heat conductive relationship with the heat sink;

heat conduction means extending through the planar heat insulating element and disposed between the planar base element and the planar wall of the heat sink, the heat conduction means being resiliently compressible and increasing in heat conductivity efficiency as compression increases;

and means heat conductively connected to the circuitry member and operable as temperature increases through specific temperature conditions to urge the circuitry member against the force of the biasing means and towards the heat sink so as to progressively compress the heat conduction means and thereby progressively increase heat conduction from the planar base element into the heat sink, said means conductively connected to the heat sink subsequently being operable as temperature decreases through the specific temperature conditions to allow the biasing means to urge the circuitry member away from the heat sink so as progressively to release compression upon the heat conductivity means and thereby progressively decrease heat conduction into the heat sink, the means heat conductively connected comprising a plurality of piston and cylinder means, each of which comprises a cylinder, piston means movable within the cylinder and extending outwardly from the cylinder, and a phase change material within a chamber of the cylinder, the biasing means urging the piston means inwardly of the cylinder into a position dictated by the volume of the phase change material, the phase change material being in a solid phase at temperatures below the specific high temperature conditions and in a liquid phase at temperatures above the specific high temperature conditions, expansion of the phase change material accompanying change to the liquid phase so as to urge the circuitry member towards the heat sink.

\* \* \* \* \*